United States Patent
Wang et al.

(10) Patent No.: US 8,241,972 B2
(45) Date of Patent: Aug. 14, 2012

(54) METHOD FOR MANUFACTURING FLEXIBLE SEMICONDUCTOR DEVICE

(75) Inventors: Xue-Shen Wang, Beijing (CN);
Qun-Qing Li, Beijing (CN)

(73) Assignees: Tsinghua University, Beijing (CN);
Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 105 days.

(21) Appl. No.: 12/781,036

(22) Filed: May 17, 2010

(65) Prior Publication Data
US 2011/0003442 A1    Jan. 6, 2011

(30) Foreign Application Priority Data
Jul. 3, 2009    (CN) .......................... 2009 1 0108702

(51) Int. Cl.
*H01L 21/00*    (2006.01)
*H01L 21/84*    (2006.01)
*H01L 21/30*    (2006.01)
*H01L 21/46*    (2006.01)

(52) U.S. Cl. ............... 438/158; 438/458; 257/E21.414; 257/E21.085

(58) Field of Classification Search .................. None
See application file for complete search history.

(56) References Cited

U.S. PATENT DOCUMENTS

| | | | |
|---|---|---|---|
| 7,534,361 B2 | 5/2009 | Akamatsu et al. | |
| 2004/0026363 A1* | 2/2004 | Akamatsu et al. | ............... 216/13 |
| 2007/0045621 A1 | 3/2007 | Suzuki et al. | |

FOREIGN PATENT DOCUMENTS

| | | |
|---|---|---|
| CN | 1645637 A | 7/2005 |
| CN | 101308904 A | 11/2008 |
| CN | 101330800 A | 12/2008 |

* cited by examiner

*Primary Examiner* — Seahvosh Nikmanesh
(74) *Attorney, Agent, or Firm* — Altis Law Group, Inc.

(57) ABSTRACT

A method for making a flexible semiconductor device includes the following steps. A rigid substrate is provided. A flexible substrate is provided, and placed on the rigid substrate. A semiconductor device is directly formed on the flexible substrate using a semiconductor process. After the rigid substrate is removed, the flexible semiconductor device is formed.

11 Claims, 4 Drawing Sheets

METHOD FOR MANUFACTURING FLEXIBLE SEMICONDUCTOR DEVICE

RELATED APPLICATIONS

This application claims all benefits accruing under 35 U.S.C. §119 from China Patent Application No. 200910108702.0, filed on Jul. 3, 2009 in the China Intellectual Property Office, the disclosure of which is incorporated herein by reference.

BACKGROUND

1. Technical Field

The present disclosure relates to methods for making semiconductor devices and, in particular, to a method for making a semiconductor device adopting a flexible substrate.

2. Discussion of Related Art

Traditional semiconductor devices, such as thin film transistors, or light emitting diodes, are usually formed on rigid substrates. Recently, semiconductor devices having flexible substrates have attracted a lot of attention. The flexible substrates are durable, light, and flexible; thus, the semiconductor devices using the flexible substrates have wide applications. However, the flexible substrates can coil, which is not conducive to execute traditional semiconductor processes on the flexible substrates directly.

An example is shown and discussed in U.S. Patent Publication No. 2007/0,045,621A1, entitled "SEMICONDUCTOR DEVICE AND MANUFACTURING METHOD THEREOF", issued to Tsunenori Suzuki, et al. on Mar. 1, 2007. This application discloses a method for manufacturing a semiconductor device. The semiconductor device is first formed on a hard substrate. Then, a flexible substrate is attached to the semiconductor device to form the flexible semiconductor device. Thus, the flexible semiconductor device is not directly formed on the flexible substrate, which makes it difficult to manufacture the flexible semiconductor device.

What is needed, therefore, is to provide a method for directly manufacturing a semiconductor device on a flexible substrate easily.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
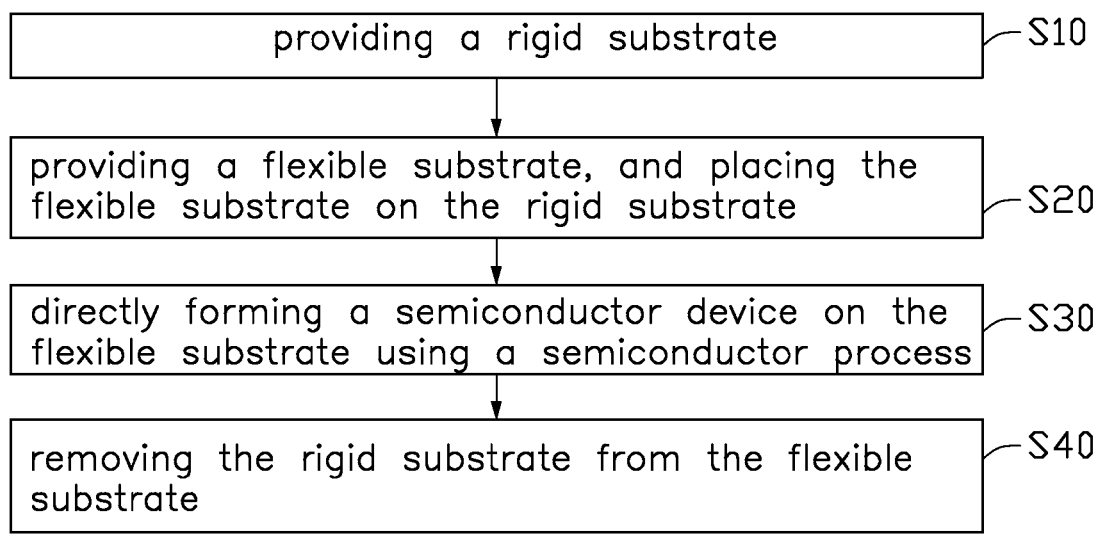
FIG. 1 is a flow chart of one embodiment of a method for making a flexible semiconductor device.
Figure 2:
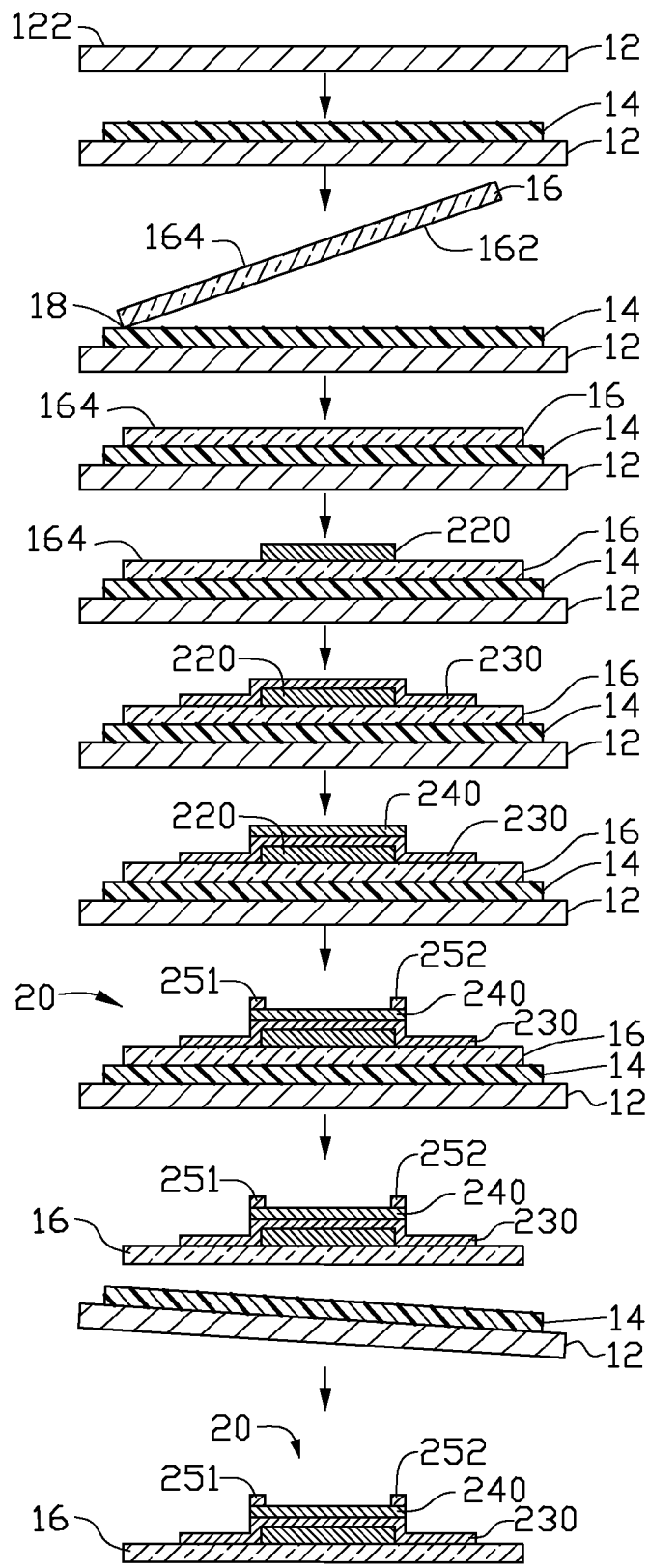
FIG. 2 is a schematic view of the method for making the flexible semiconductor device of FIG. 1.

Referring to FIG. 1 and FIG. 2, a method for making a flexible semiconductor device is provided. The method includes the following steps:

(S10) providing a rigid substrate 12;

(S20) providing a flexible substrate 16, and placing the flexible substrate 16 on the rigid substrate 12;

(S30) forming a semiconductor device directly on the flexible substrate 16 using a semiconductor process; and (S40) removing the rigid substrate 12 from the flexible substrate 16.

In step (S10), the rigid substrate 12 has a flat surface 122. In order to ensure the flat surface 122 is clean, it can be cleaned by acetone, deionized water, and oxygen plasma in sequence. It is noteworthy that other organic solvents, such as isopropanol or enthanol, can substitute the acetone. The substrate 12 can be made of glass, quartz, silicon nitride, silicon oxynitride, metal, or rigid plastic. A shape of the rigid substrate 12 is arbitrary, and can be selected as desired. In one embodiment, the rigid substrate 12 is a square glass board.

Step (S20) can includes the following steps:

(S22) forming an adhesive layer 14 on the rigid substrate 12;

(S24) providing the flexible substrate 16, wherein the flexible substrate 16 has a first surface 162 and a second surface 164 opposite to the first surface 162;

(S26) applying the flexible substrate 16 on the adhesive layer 14; and (S28) solidifying the adhesive layer 14.

In step (S22), an adhesive material can be provided. The adhesive material can be fluid, and be cured. The adhesive material can be undissolvable in acetone, isopropanol or ethanol. The adhesive material can be polyimides, polyamide, polyester, epoxy resin, acrylic resin, silicone, melamine resin, phenolic resin, or polydimethyl siloxane. The adhesive layer 14 can cover the rigid substrate 12 uniformly, and can be formed by spinning or coating the adhesive material on the rigid substrate 12. In one embodiment, the adhesive material is polydimethyl siloxane. The adhesive layer 14 is formed by spinning the adhesive material on the rigid substrate 12. Once the rigid substrate 12 is clean, the adhesive layer 14 can be firmly adhered to the rigid substrate 12.

In step (S24), the flexible substrate 16 can be cleaned by acetone, deionized water, and oxygen plasma in sequence. It is noteworthy that other organic solvents, such as isopropanol or enthanol, can substitute the acetone. The flexible substrate 16 is soft, thin and light. The flexible substrate 16 can be made of polyethylene terephthalate, poly(ethylene 2,6-naphthalate), polyethersulfone, polycarbonate, polyetherimide, polyphenylene sulfide, polyphenylene ether, polysulfone, or polyphthalamide resin. A thickness and a shape of the flexible substrate 16 can be selected as desired. The thickness of the flexible substrate 16 can be larger than or equal to 10 microns. In one embodiment, the flexible substrate 16 is made of transparent polyethylene terephthalate, the thickness of the flexible substrate 16 is about 30 microns, and the shape of the flexible substrate 16 is rectangular.

In step (S26), the first surface 162 of the flexible substrate 16 can be secured to the rigid substrate 12. In step (S26), one edge 18 of the first surface 162 of the flexible substrate 16 contacts with the unsolidified adhesive layer 14, the flexible substrate 16 can be deposited on the adhesive layer 14 slowly. Thus, air bubbles that are possibly located between the flexible substrate 16 and the adhesive layer 14 can be removed, and the flexible substrate 16 can be adhered to the adhesive layer 14 firmly. The flexible substrate 16 is smooth, and not prone to coiling during the above steps.

In step (S28), the rigid substrate 12 with the flexible substrate 16 thereon is put into a vacuum, and is vacuumized to remove all possible air bubbles between the first surface 162 of the flexible substrate 16 and the adhesive layer 14. Thus, the second surface 164 of the flexible substrate 16 can be flat. The adhesive layer 14 can be solidified by natural drying, oven curing, or freeze drying. In one embodiment, the polydimethyl siloxane is solidified by natural drying.

The flexible substrate 16 is located on the solidified adhesive layer 14, which can avoid coiling or fluctuating, thereby adhering to the adhesive layer 14 firmly. The resulting flexible substrate 16 can be flat enough to execute a semiconductor process directly for making a flexible semiconductor device thereon.

It can be understood that the step (S26) can be executed in a vacuum. If so, the vacuuming in the step (S28) does not need to be executed.

In step (S30), the semiconductor process is directly executed on the second surface 164 of the flexible substrate 16. The semiconductor process can include at least one of a chemical depositing process, a sputtering process, an evaporating process, and an etching process. The semiconductor device can be a thin film transistor, a field emission transistor, a light emitting diode, or a photovaristor.

In one embodiment, a bottom gate thin film transistor 20 is formed on the flexible substrate 16 by a semiconductor process, including the following steps:

(S32) forming a gate electrode 220 on the cleaned second surface 164 of the flexible substrate 16;

(S34) covering the gate electrode 220 with an insulated layer 230;

(S36) forming a semiconductor layer 240 on the insulated layer 230; and (S38) forming a source electrode 251 and a drain electrode 252 on the semiconductor layer 240, wherein the source electrode 251 and the drain electrode 252 are spaced from each other and electrically connected to the semiconductor layer 240.

In step (S32), the gate electrode 220 can have a good conductive property, and can be made of pure metals, metal alloys, indium tin oxide (ITO), antimony tin oxide (ATO), silver paste, conductive polymers, and carbon nanotube films. Pure metals can be aluminum, copper, tungsten, molybdenum and gold. Metal alloys can be at least two of aluminum, copper, tungsten, molybdenum and gold. When the gate electrode 220 is made of pure metals, metal alloys, indium tin oxide (ITO), or antimony tin oxide (ATO), the gate electrode 220 can be formed by a depositing, sputtering, evaporating method, or etching process. When the gate electrode 220 is made of silver paste, conductive polymers or carbon nanotube films, the gate electrode 220 can be formed by a conglutinating method or a print method. A thickness of the gate electrode 220 can be about 0.5 nanometers to 100 microns.

In one embodiment, the gate electrode 220 is indium tin oxide, and can be formed by the following two methods. The first method includes the following steps coating a photoresist layer (not shown) on the second surface 164 of the flexible substrate 16; patterning a gate electrode region on the photoresist layer to expose the second surface 164 by an etching method; depositing an indium tin oxide layer on the second surface 164 in the gate electrode region; and removing the photoresist layer by acetone or other organic solvents. Thus, the gate electrode 220 is formed on the second surface 164 of the flexible substrate 16.

The second method includes the following steps. An indium tin oxide layer is deposited on the second surface 164. A photoresistor layer is coated on the indium tin oxide layer. The photoresistor layer out of a gate electrode region and the indium tin oxide layer out of the gate electrode region are removed by an etching method. An organic solvent removes the photoresistor layer on the gate electrode region, thereby forming the gate electrode 220 on the flexible substrate 16. In one embodiment, the thickness of the gate electrode 220 is about 1 micron.

In step (S34), the insulated layer 230 can be made of a rigid material such as silicon nitride ($Si_3N_4$) or silicon dioxide ($SiO_2$), or a flexible material such as PET, benzocyclobutenes (BCB), or acrylic resins. The insulated layer 230 can be formed by depositing, sputtering, evaporating, or printing method according to the material thereof. A thickness of the insulated layer 230 can be in a range from about 0.5 nanometers to about 100 microns. In one embodiment, a benzocyclobutenes insulated layer 230 is printed and covered on the gate electrode 220. The thickness of the insulated layer 230 is about 1 micron.

In step (S36), the semiconductor layer 240 can be made of amorphous silicons, polycrystalline silicons, organic semiconductor polymers, nano-films, nanowire structures, or nanotubes. The semiconductor layer 240 can be formed by depositing, printing, or transfer printing method according to material thereof. A thickness of the semiconductor layer 240 can be in a range from about 0.5 nanometers to about 100 microns. In one embodiment, the semiconductor layer 240 is formed by printing a carbon nanotube film on the insulated layer 230. The thickness of the semiconductor layer 240 is about 1 micron.

In step (S38), the source electrode 251 and drain electrode 252 can have a good conductive property, and can be pure metals, metal alloys, indium tin oxide (ITO), antimony tin oxide (ATO), silver paste, conductive polymers, or carbon nanotube films. The source electrode 251 and drain electrode 252 can be formed by depositing, sputtering, evaporating, or etching method according to the material thereof. A thickness of the source electrode 251 and drain electrode 252 can be in a range from about 0.5 nanometers to about 100 microns. The source electrode 251 and drain electrode 252 are spaced from about 1 micron to about 100 microns. In one embodiment, the method for making the source electrode 251 and drain electrode 252 is the same as that of the gate electrode 230. The thickness of the source electrode 251 and drain electrode 252 is about 1 micron, and the material of those is aluminum. The source electrode 251 and drain electrode 252 are spaced from about 50 microns.

In step (S40), the rigid substrate 12 and the adhesive layer 14 can be peeled off from the flexible substrate 16 by for example, a mechanical force. The flexible thin film transistor 20 having a bottom gate structure is formed. The flexible substrate 16 can still have good transparency and flexibility after the rigid substrate 12 has been separated from the flexible substrate 16. It is noteworthy that the flexible substrate 16 and the rigid substrate 12 can be separated by other methods, such as a heating method or an etching method.

Figure 3:
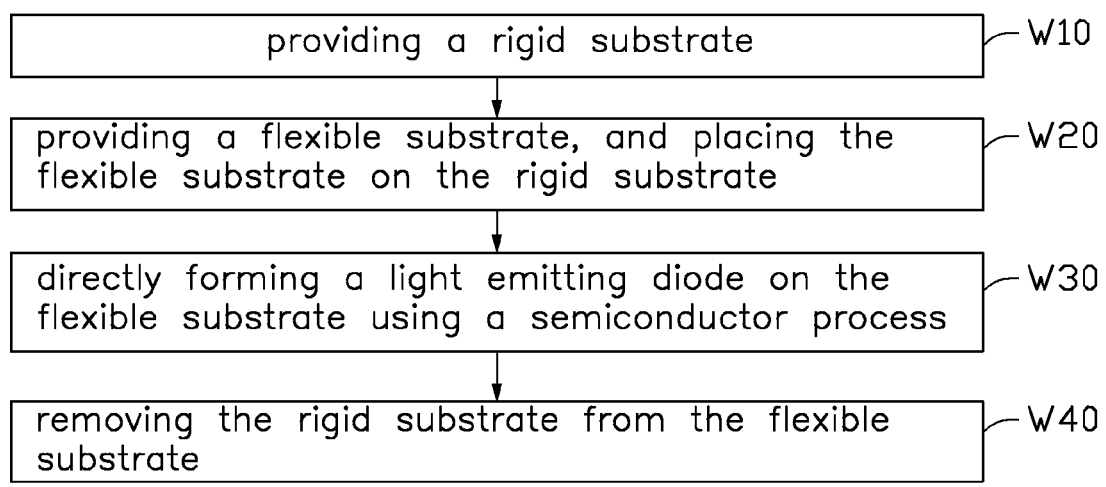
FIG. 3 is a flow chart of one embodiment of a method for making a flexible semiconductor device.
Figure 4:
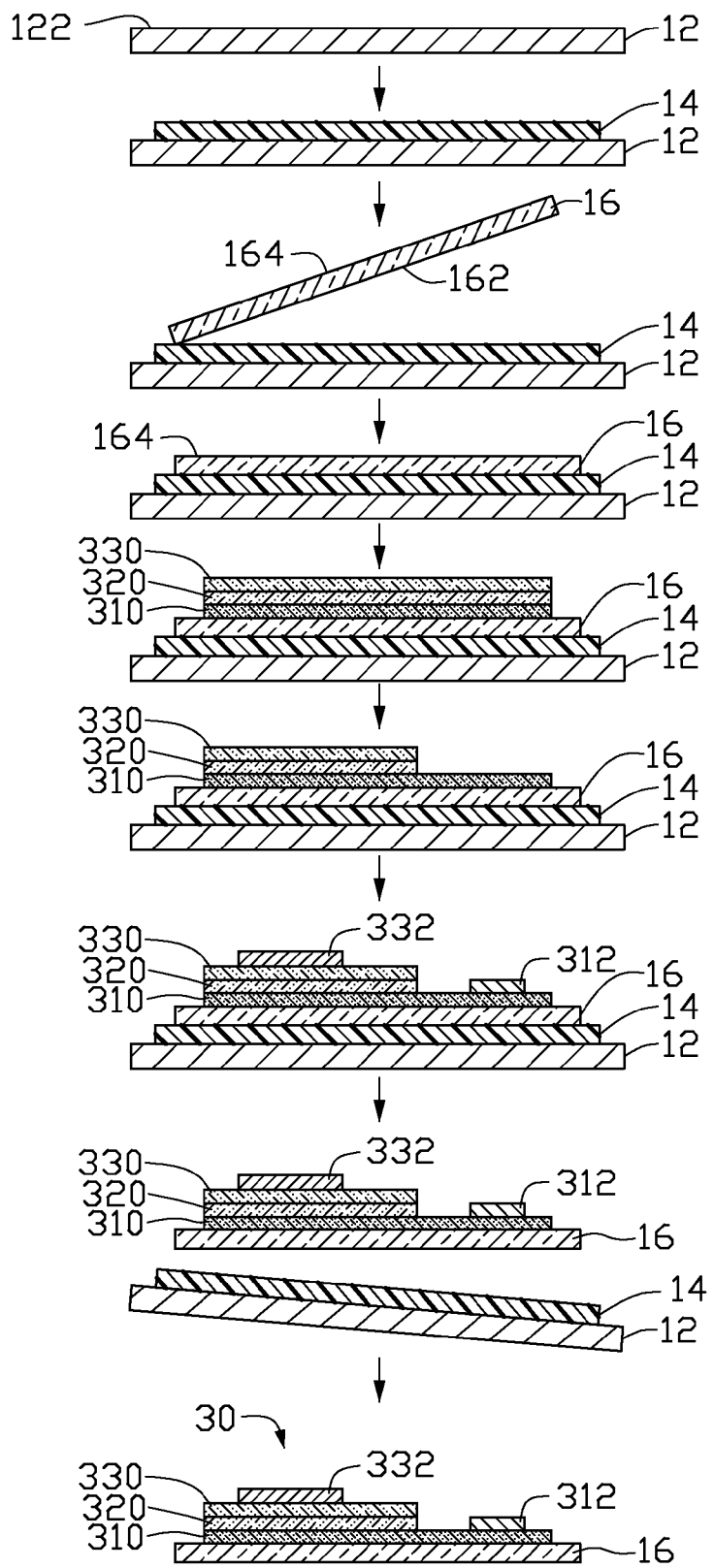
FIG. 4 is a schematic view of the method for making the flexible semiconductor device of FIG. 3.

Referring to FIG. 3 and FIG. 4, another embodiment of a method for making a light emitting diode 30 with a flexible substrate is provided. The method for making the light emitting diode 30 includes the following steps:

(W10) providing a rigid substrate 12 with a surface 122;

(W20) providing a flexible substrate 16 with a first surface 162 and a second surface 164 opposite to the first surface 162, and the first surface 162 being placed on the surface 122 of the rigid substrate 12;

(W30) directly forming a light emitting diode on the second surface 164 of the flexible substrate 16 using a semiconductor process; and (W40) removing the rigid substrate 12 from the flexible substrate 16.

Step (W10) and step (W20) can be executed as the methods of step (S10) and step (S20).

Step (W30) can include the following steps:

(W32) forming a first semiconductor layer 310, an active layer 320 and a second semiconductor layer 330 on the second surface 164 of the flexible substrate 16 in sequence;

(W34) partly etching the second semiconductor layer 330 and the active layer 320 to expose the first semiconductor layer 310; and (W36) forming a second electrode 332 on the second semiconductor layer 330, the second electrode 332 being electrically connected to the second semiconductor layer 330, and forming a first electrode 312 on the first semiconductor layer 310, the first electrode 312 being electrically connected to the first semiconductor layer 310.

In step (W32), the first semiconductor layer 310, the active layer 320, and the second semiconductor layer 330 are deposited on the second surface 164 of the flexible substrate 16 via, for example, a process of metal organic chemical vapor deposition (MOCVD).

If the first semiconductor layer 310 is an N-type semiconductor, the second semiconductor layer 330 is a P-type semiconductor, and vice versa. In one embodiment, the first semiconductor layer 310 is an N-type semiconductor and the second semiconductor layer 330 is a P-type semiconductor. The first semiconductor layer 310 is configured to provide electrons, and the second semiconductor layer 330 is configured to provide holes. The first semiconductor layer 310 may be made of N-type gallium nitride, N-type gallium arsenide, or N-type copper phosphate. The second semiconductor 330 may be made of P-type gallium nitride, P-type gallium arsenide, or P-type copper phosphate. In one embodiment, the first semiconductor layer 310 is made of N-type gallium nitride and has a thickness of about 2 microns, and the second semiconductor layer 330 is made of P-type gallium nitride and has a thickness of about 0.3 microns.

The active layer 320 is a photon excitation layer and can be one of a single layer quantum well film or multilayer quantum well films. The active layer 320 is made of GaInN, AlGaInN, GaSn, AlGaSn, GaInP, or GaInSn. In one embodiment, the active layer 320 has a thickness of about 0.3 μm and includes one layer of GaInN and another layer of GaN. The GaInN layer is stacked with the GaN layer.

In one embodiment, the step (W34) is executed by an inductance coupling plasma etching process.

In step (W36), the first electrode 312 and the second electrode 332 are electrically insulated from each other, and can be formed by a physical vapor depositing method, such as by a vacuum evaporation method, an electron beam evaporation method, or an ion beam sputtering method. The first electrode 312 and the second electrode 332 can be made of titanium (Ti), aluminum (Al), nickel (Ni), gold (Au), and any combination thereof. The first electrode 312 and the second electrode 332 can have a single-layer structure or a multi-layer structure. In one embodiment, both the first electrode 312 and the second electrode 332 are made by an electron beam evaporation method, and have a two-layer structure including one layer of Ti and another layer of Au.

Step (W40) can be executed by the same method as that of the step (S40).

As described above, the method for making a semiconductor device with a flexible substrate has some advantages. The flexible substrate is applied on the adhesive layer before the adhesive layer has been solidified, which can avoid coiling or fluctuating thereof. The flexible substrate is also flat enough to execute a semiconductor process for making a flexible semiconductor device. There is no need to form a semiconductor device first, and then adhere a flexible substrate to the semiconductor device. The present method for making the flexible semiconductor device is simple and easy to operate. Furthermore, the method for peeling the rigid substrate is easy and has little effect on the transparency of the flexible substrate.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for making a flexible semiconductor device, comprising:
    (a) providing a rigid substrate;
    (b) providing a flexible substrate, and placing the flexible substrate on the rigid substrate, wherein the step (b) comprises:
    (b12) forming an adhesive layer on the rigid substrate;
    (b14) applying the flexible substrate on the adhesive layer;
    (b15) removing air bubbles between the flexible substrate and the adhesive layer by a vacuumizing method; and
    (b16) solidifying the adhesive layer;
    (c) directly forming a semiconductor device on the flexible substrate using a semiconductor process; and
    (d) removing the rigid substrate from the flexible substrate.

2. The method of claim 1, wherein the flexible substrate comprises a material selected form the group consisting of polyethylene terephthalate, poly(ethylene 2,6-naphthalate), polyethersulfone, polycarbonate, polyetherimide, polyphenylene sulfide, polyphenylene ether, polysulfone, and polyphthalamide resin.

3. The method of claim 1, wherein the step (b12) comprises:
    providing a material of the adhesive layer;
    cleaning the rigid substrate; and
    coating the material of the adhesive layer on the cleaned rigid substrate.

4. The method of claim 3, wherein the step of cleaning the rigid substrate is executed by an organic solvent, deionized water, and oxygen plasma in sequence.

5. The method of claim 1, wherein the adhesive layer comprises a material selected form the group consisting of polyimides, polyamide, polyester, epoxy resin, acrylic resin, silicone, melamine resin, phenolic resin, and polydimethyl siloxane.

6. The method of claim 1, wherein the semiconductor process comprises at least one of a sputtering process, an evaporation process, a chemical depositing process, and an etching process.

7. The method of claim 1, wherein the semiconductor device comprises a thin film transistor, a field emission transistor, a light emitting diode, or a photovaristor.

8. The method of claim 1, wherein the semiconductor device is a thin film transistor, and the step (c) comprises:
    forming a gate electrode on the flexible substrate;

covering the gate electrode with an insulated layer;

forming a semiconductor layer on the insulated layer; and forming a source electrode and a drain electrode on the semiconductor layer, the source electrode and the drain electrode being spaced from each other and electrically connected with the semiconductor layer.

9. The method of claim 1, wherein the semiconductor device is a light emitting diode, and the step (c) comprises:

forming a first semiconductor layer, an active layer, and a second semiconductor layer in sequence on the flexible substrate;

partly etching the second semiconductor layer and the active layer to expose the first semiconductor layer;

forming a second electrode on the second semiconductor layer, the second electrode being electrically connected to the second semiconductor layer; and forming a first electrode on the first semiconductor layer, the first electrode being electrically connected to the first semiconductor layer, and the first electrode and the second electrode being electrically insulated from each other.

10. The method of claim 1, wherein the step (d) is executed by a mechanical force peeling method, a heating method, or an etching method.

11. A method for making a flexible semiconductor device, comprising:

(a) providing a rigid substrate;

(b) providing a flexible substrate having a first surface and a second surface opposite to the first surface;

(c) securing the first surface of the flexible substrate to the rigid substrate, the step (c) further comprising:
 (c1) forming an adhesive layer on the rigid substrate;
 (c2) applying the first surface of the flexible substrate on the adhesive layer;
 (c3) removing air bubbles located between the first surface of the flexible substrate and the adhesive layer by a vacuumizing method; and
 (c4) solidifying the adhesive layer;

(d) directly forming a semiconductor device on the second surface of the flexible substrate using a semiconductor process; and (e) removing the rigid substrate from the second surface of the flexible substrate.

* * * * *